(12) United States Patent
Maier-Richter et al.

(10) Patent No.: US 8,487,322 B2
(45) Date of Patent: Jul. 16, 2013

(54) LUMINOUS BODY WITH LED DIES AND PRODUCTION THEREOF

(75) Inventors: Andrea Maier-Richter, Erkrath (DE); Eckard Foltin, Sinzig (DE); Michael Roppel, Burscheid (DE); Peter Schibli, Solothurn (CH)

(73) Assignee: Bayer Intellectual Property GmbH, Monheim (DE)

( * ) Notice: Subject to any disclaimer, the term of this patent is extended or adjusted under 35 U.S.C. 154(b) by 169 days.

(21) Appl. No.: 12/337,884

(22) Filed: Dec. 18, 2008

(65) Prior Publication Data

US 2009/0242903 A1    Oct. 1, 2009

(30) Foreign Application Priority Data

Dec. 19, 2007  (DE) .................. 10 2007 061 261

(51) Int. Cl.
*H01L 29/40*  (2006.01)

(52) U.S. Cl.
USPC ............. 257/88; 257/89; 257/99; 257/91; 257/100; 257/676; 257/690; 257/692; 257/723; 257/773; 257/784; 257/786; 257/E51.022; 257/E23.01; 257/E23.011; 257/E23.012; 257/E23.031; 257/E23.032; 257/E23.033; 257/E23.042; 257/E23.043; 257/E23.066; 257/E23.079

(58) Field of Classification Search
None
See application file for complete search history.

(56) References Cited

U.S. PATENT DOCUMENTS

| | | | |
|---|---|---|---|
| 2001/0012677 A1* | 8/2001 | Sameshima | 438/458 |
| 2002/0021384 A1* | 2/2002 | Taniguchi et al. | 349/65 |
| 2003/0072153 A1* | 4/2003 | Matsui et al. | 362/231 |
| 2003/0160256 A1* | 8/2003 | Durocher et al. | 257/88 |
| 2004/0051109 A1* | 3/2004 | Ishizaki et al. | 257/89 |
| 2006/0097291 A1* | 5/2006 | Takahashi et al. | 257/257 |
| 2006/0120097 A1 | 6/2006 | Schmierer | |
| 2006/0157724 A1* | 7/2006 | Fujita | 257/99 |
| 2007/0194333 A1* | 8/2007 | Son | 257/88 |
| 2007/0211490 A1* | 9/2007 | Chou | 362/555 |
| 2008/0137331 A1* | 6/2008 | Kaneko et al. | 362/231 |
| 2008/0173884 A1* | 7/2008 | Chitnis et al. | 257/98 |

FOREIGN PATENT DOCUMENTS

| | | |
|---|---|---|
| DE | 102004054822 A1 | 5/2006 |
| JP | 05053511 | 3/1993 |
| JP | 2000331523 | 11/2000 |
| WO | WO-2004/062908 | 7/2004 |

\* cited by examiner

*Primary Examiner* — Wael Fahmy

(57) ABSTRACT

A luminous body comprises a transparent plastic moulding with indentations, and LED DIEs disposed within the indentations. One side of each LED DIE lies approximately flush with an upper side of the moulding, and each LED DIE is connected to an electricity supply via electrical conductors disposed on the moulding. A method for producing such a luminous body is also disclosed.

11 Claims, 1 Drawing Sheet

LUMINOUS BODY WITH LED DIES AND PRODUCTION THEREOF

BACKGROUND OF THE INVENTION

1. Priority

Priority is claimed to German Patent Application 10 2007 061 261.5, filed Dec. 19, 2007. The disclosure of the aforementioned document is incorporated herein by reference in its entirety.

2. Field of the Invention

The field of the present invention relates to luminous bodies made of a transparent plastic moulding with indentations which contain electronic components, in particular LED DIEs, and to the production thereof.

3. Background

Alternative concepts to conventional light sources and modules, for example incandescent bulbs or energy-saving lamps, are questionable in respect of longevity and energy efficiency.

Incandescent lamps are disadvantageous owing to their poor efficiency in respect of light emission and high development of heat, as well as the short lifetime. In Australia, in the coming years, incandescent bulbs will by law be entirely taken off the market and replaced by other concepts.

Energy-saving lamps are much more energy-efficient, but they represent an environmental burden owing to heavy metal contents, in particular mercury, and must be disposed of as hazardous waste.

LEDs are an alternative light source, which does not have these disadvantages and also has a long lifetime and high energy efficiency.

LEDs are gaining increased use as light sources, for example in the automotive industry, spaceflight, interior lighting, exterior wall configuration, etc.

Attempts are currently being made to establish LEDs as a 1:1 alternative to conventional light sources. LED development is therefore being pushed in the direction of more power and greater brightness. These high performance requirements, and the concomitant pointwise development of heat, represent a great challenge for the materials being used. The light emission of LED DIEs generally lies in the 15-20% range, which necessitates the use of lens systems. This is currently done using primary optics which are integrated directly as constituents into the LED, or secondary optics which are combined as lenses or lens systems with the LED afterwards.

The LEDs are applied onto printed circuit boards. The heat is dissipated via integrated or subsequently applied systems. The LED-equipped printed circuit board may in general be protected against moisture and dirt by a plastic housing. The plastic housing is transparent in the exit region of the LED radiation, and is optionally designed as a lens body.

In microelectronics, support elements such as printed circuit boards or electrically conductive films are equipped with semiconductor chips (so-called "DIEs").

Modules which contain support elements with a plane support surface, on which LED DIEs or other electronic components are arranged, have been known for a long time and are conventional. Such an arrangement leads to the formation of a step between the support surface and the upper side of the components arranged on it. In practice, it has been found that such modules are difficult to handle. In particular, the arrangement is unfavourable for the production of an electrical contact of the electronic component with neighbouring constituents (for example conductor tracks). Furthermore, precise placement of the components on the support element—for example with the aid of a so-called "pick and place" method—is difficult and/or possible only with the aid of expensive and complicated devices.

SUMMARY OF THE INVENTION

A luminous body comprises a transparent plastic moulding and LED DIEs. The moulding includes a plurality of indentations, and at least one of the LED DIEs is disposed in at least one of the indentations, such that one side of each LED DIE lies approximately flush with the upper side of the plastic moulding. Further, each LED DIE is connected to an electricity supply via electrical conductors disposed on the plastic moulding.

In the production of a luminous body, a thermoplastic material is introduced into a mould by injection moulding, with the mould being a negative imprint of the plastic moulding being produced. The plastic moulding thusly formed is transparent, includes a plurality of indentations, and is removed from the moulding. Conductor tracks are applied onto the plastic moulding, and at least one LED DIE is placed into each of the indentations, such that one side of each LED DIE lies approximately flush with the upper side of the plastic moulding, and poles of each LED DIE are in contact with at least one conductor track.

Additional options, described in detail below, may be incorporated into the luminous body and the production thereof. Such options may be incorporated singly or in combination.

Accordingly, an improved luminous body with LED DIEs is disclosed. Advantages of the improvements will appear from the drawings and the description of the preferred embodiment.

BRIEF DESCRIPTION OF THE DRAWINGS

In the drawings, wherein like reference numerals refer to similar components.

DETAILED DESCRIPTION OF THE PREFERRED EMBODIMENTS

Figure 1:
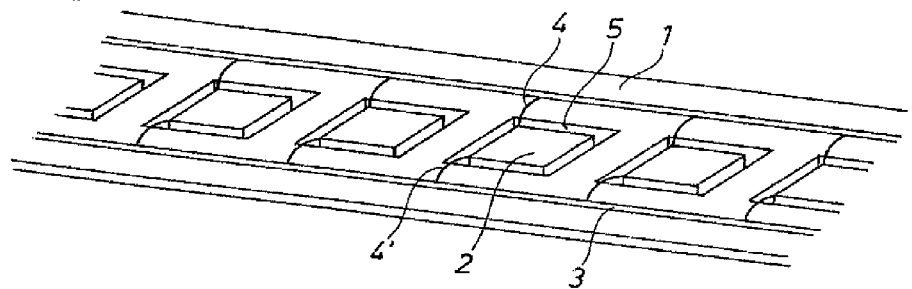
FIG. 1 shows a perspective detail view of a luminous body.
Figure 2:
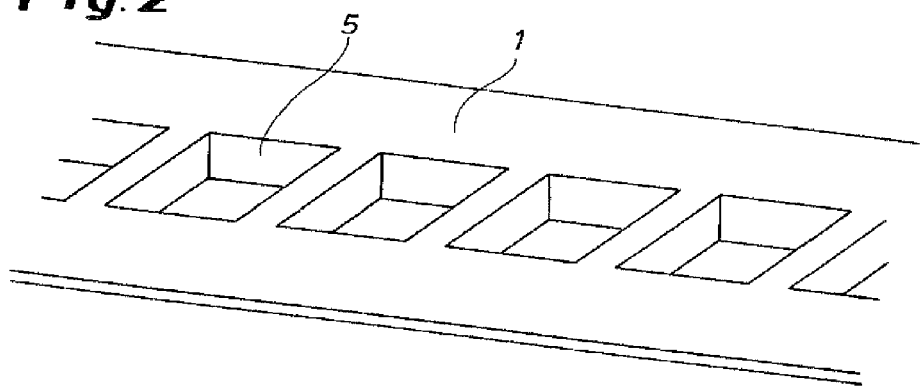
FIG. 2 shows a perspective representation of indentations formed in the moulding during the production process.
Figure 3:
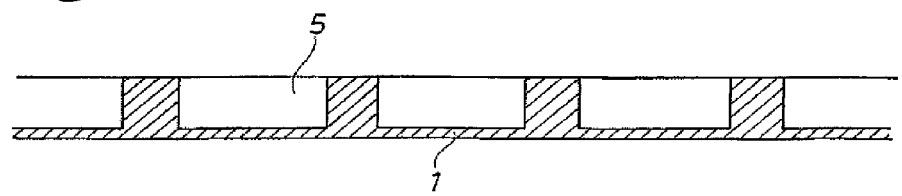
FIG. 3 shows a cross sectional view of the moulding of FIG. 2.

A luminous body is shown FIG. 1. The luminous body is formed by a transparent plastic moulding (1) having indentations (5), and LED DIEs (2) disposed within the indentations (5). The indentations (5) are configured so that LED DIEs placed therein lie approximately flush with the upper side of the moulding. Electrical conductor tracks (3), to which the poles (4, 4') of each LED DIE are contacted, extend on the upper side of the moulding. The electrical conductors (3) are preferable placed on the surface of the plastic moulding and serve to connect the LED DIEs to an electricity supply (not shown). FIGS. 2 & 3 shows the plastic moulding (1), with indentations (5), prior to placement of the LED DIEs.

One advantage of the luminous body is the possibility of having a small installation space depth, which is advantageous for flat applications. A high degree of freedom is furthermore available in the moulding operation, inter alia by the preferred injection moulding method, with which the plastic moulding is produced. Additional advantages are provided by such a luminous body. For example, the luminous body is easier to handle, has good lighting properties, and can be produced without complications. In particular, the process for production, described in further detail below, allows precise positioning of the electronic components (LED DIEs) on the plastic moulding in a straightforward way. Incorporation of electrical contacts on the plastic moulding is also easy to achieve.

Placing the electronic component (LED DIE) in the indentations of the moulding has various advantages. For instance, the electronic component (LED DIE) can be positioned precisely on the plastic moulding. The indented arrangement of the LED DIE furthermore leads to level equalisation between the upper side of the moulding and the upper side or free surface of the LED DIE.

The indentation may be configured so that the upper side of the LED DIE lies approximately flush with the upper side of the moulding. This arrangement has the advantage that an electrical contact of the LED DIE to further LED DIEs and/or electrical conductors (3) can be produced in a straightforward way. The indentations of the plastic moulding are preferably provided by injection moulding methods, and have a bottom and a side wall connecting the bottom to the upper side of the moulding. At the dimensions to be achieved, machining methods reach their performance limits. The injection moulding method allows reproducible and economical fabrication of plastic mouldings which are intended for large production runs.

The plastic moulding is preferably formed from transparent plastic, for example polycarbonate (PC), polystyrene (PS) and polymethyl methacrylate (PMMA), polysulfone, high-temperature stable PC (Apec® from Bayer MaterialScience AG), cycloolefin copolymer (COC) (Topas® from Ticona). The light transmission for transparent, colourless material should be at least 80%, preferably at least 85%, particularly preferably at least 89% (measured according to ISO 13468-2 with a 1 mm specimen body thickness). The plastic should have very good rheological properties, heat resistance and good resistance to LED radiation, mechanical stability and a high refractive index. The luminous body disclosed herein opens up solution possibilities for applications in which light is emitted in various ways from the plastic moulding.

Preferably, the LED DIEs are fitted into the indentations so that the emitted light radiates through the bottom of the indentation. This has the advantage that the LED DIEs can easily be contacted to electrical conductor tracks which are located on the upper side of the moulding, on the open side of the indentations.

The plastic moulding may preferably be covered with a plastic protective film, preferably polycarbonate, on the side of the open indentations. This film may advantageously also comprise a reflection layer.

In the event that the LED DIEs are fitted into the indentations so that the light radiates on the open side of the indentation, the two poles of the LED DIEs are contacted through point openings (which may for example be produced in the bottom of the indentations by lasers) in the bottom of the indentations. The conductor tracks are in this case located on the opposite side of the plastic moulding from the open side of the indentation. The plastic moulding may preferably be covered with a transparent plastic protective film, preferably of polycarbonate, on the open side of the indentations in order to protect the LED DIEs.

An additional reflection layer, which is applied onto the plastic moulding before the LED DIEs are fitted, is particularly advantageous.

The LED DIEs may also be fitted into the indentations so that the light radiates through the bottom of the indentation. The two poles of the LED DIEs are then preferably contacted by the conductor tracks on the open side of the indentations.

Preferably, in the event that "flip-chip LEDs" (poles lie on one side) are not being used, one pole is preferably contacted on the open side of the indentation and one pole is respectively contacted on the opposite side (through the bottom of the indentation) by the conductor tracks.

The conductor tracks, which are used for electrical connection of the LED DIEs to an electricity source, may be formed from conventional copper or silver or gold wires. It is however preferred to use conductive polymers, which are preferably transparent. Conductive polymers are preferably selected from the group; polypyrrole, polyaniline, polythiophene, polyphenylene vinylene, polyparaphenylene, polyethylene dioxythiophene, polyfluorene, polyacetylene, particularly preferably polyethylene dioxythiophene in combination with polystyrene sulfonate (for example Baytron®P from H.C. Starck).

Conductive inks based on nanoparticles (for example nanosilver, nanogold) may be used. By using inks filled with metal particles in the nanometre range, electrically conductive tracks with virtually any geometries can be printed on plastic, for example with the aid of inkjet technology. It is particularly desirable in this case for the line width of such conductor tracks to achieve 20 µm, or even less than this. Below this limit, structures are generally no longer visible to the human eye and a perturbing optical effect due to conductor tracks is eliminated.

Furthermore, inks containing CNTs (CNT—carbon nanotubes, for example Baytubes® from Bayer MaterialScience AG) may also be used for the conductor tracks.

It is likewise possible to use indium-tin oxide as a conductive material.

An electrical connection between an LED DIE and a conductor track may, for example, be produced with the aid of a "wire bonding" method.

The plastic moulding may comprise a multiplicity of indentations ("reception wells") in the form of MICRO cavities.

The side walls of the indentations may be designed to be straight, concave or convex. Side walls with a straight profile have the advantage that they are particularly suitable for highly precise reception of the LED DIEs.

The side walls may extend perpendicularly to the bottom, or to the upper side of the moulding.

As an alternative, the side walls may also be chamfered in relation to the upper side of the moulding, at an inclination angle which lies between 1° and 89°.

It may be particularly advantageous for the side walls of the indentations to taper towards the bottom, and respectively to define an inclination angle of from 5° to 85°, preferably from 20° to 70° and particularly preferably about 45°.

Depending on the configuration of the LED DIEs in plan view, the indentations may have a rectangular, circular or polygonal contour.

The indentation (reception well) may have a step-like configuration in cross section, which forms at least one stepped bottom section parallel to the bottom, or to the upper side of the moulding.

The LED DIE may be fixed in the indentation by a casting compound. The casting compound may be a resin, for example epoxy resin, 2K polyurethane casting resin (Baygal®, Baymidur® from Bayer MaterialScience AG). This adhesive may preferably be transparent. The adhesive may if need be also contain phosphorescent pigments (so-called phosphors).

The luminous bodies are preferably produced in the following way:

a) A thermoplastic material is introduced into a mould by injection moulding. The mould comprises the negative imprint of the plastic moulding to be produced. After cooling, the transparent plastic moulding with its indentations is removed from the mould. The edge length of the indentations lies in the range of 50-4000 µm. The height of the indentations particularly preferably lies between 50-200 µm. The dimensions of the indentations are adapted to the size of the LED DIEs, which preferably have an edge length in the range of 40-3800 µm.

b) The conductor tracks are preferably applied onto the moulding, preferably by screen printing or inkjet technology.

c) In a next step, the LED DIEs are placed or adhesively bonded into the indentations. When using so-called "flip-chip LEDs", the poles lie on one side so that the LED DIEs can be contacted by the conductor tracks on one side. Preferably, the poles of the LED DIEs lie on the open side of the indentations and are contacted by the conductor tracks on this side.

d) Finally a plastic film, preferably provided with a reflection layer, may be applied onto the open side of the indentations as a protective layer for the conductor tracks on the moulding equipped with the LED DIEs.

e) The luminous body is connected to an electricity source via a plug connection.

In the event that the LED DIEs are placed into the indentations so that the poles are fitted through the bottom of the indentations, the method is preferably carried out as follows:

a') A thermoplastic material is introduced into a mould by injection moulding. The mould comprises the negative imprint of the plastic moulding to be produced. After cooling, the transparent plastic moulding with its indentations is removed from the mould. The size of the indentations lies in the range of 50-4000 µm.

b') The injected moulding may optionally be provided with a reflection layer on the open side of the indentations, preferably by screen printing.

c') The conductor tracks are applied onto the opposite side from the open side of the indentations, preferably by screen printing.

d') The LED DIEs are fitted or adhesively bonded into the indentations, the poles of the LED DIEs being contacted through the bottom of the indentation.

e') The moulding equipped with LED DIEs may be provided with a protective film in order to protect the conductor tracks on this side. A transparent film or a transparent plastic moulding may additionally be applied onto the open side of the indentations.

f') The luminous body may be connected to an electricity source via a plug connection.

In the production process described above, thermally conductive additives may be added to the plastic before it is shaped in the mould, so that the heat generated by the LED DIEs can be dissipated more effectively.

The additional transparent plastic moulding in e'), which is optionally applied onto the luminous body, preferably includes microlenses, these microlenses being arranged so that one microlens is respectively placed over each LED DIE.

As an alternative to the aforementioned plastic moulding with microlenses (with the effect of focusing and increasing efficiency), a plastic moulding (plastic film) with diffusor properties may be used so as to create the impression of a "flat light" instead of a light with point light sources (LED DIEs).

If phosphorescent pigments (so-called phosphors) are incorporated or applied into this plastic film or this plastic moulding, then for example white light may be generated when blue LED DIEs are being used. Various effects can be achieved by the use of phosphors.

When using LED DIEs in which the poles do not lie on one side, the method for producing the luminous body is carried out as follows:

First, the plastic moulding with the indentations is produced. The conductor tracks are then applied onto both sides of the moulding. The indentations are equipped with the LED DIEs, the poles being contacted by the conductor tracks (in each case one pole on the open side of the indentations and one pole through the bottom of the indentations). By means of an electricity source, current is supplied to the LED DIEs via a plug connection through the conductor tracks.

A plastic film, optionally provided with a reflection layer, is preferably applied onto the open side of the indentations of the moulding, in which case the LED DIEs radiate through the bottom of the indentations.

A transparent plastic film or a transparent plastic moulding may preferably be applied onto the moulding, on the open side of the indentations, in which case the LED DIEs radiate on the open side of the indentations.

Thus, a luminous body with LED DIEs is disclosed. While embodiments of this invention have been shown and described, it will be apparent to those skilled in the art that many more modifications are possible without departing from the inventive concepts herein. The invention, therefore, is not to be restricted except in the spirit of the following claims.

What is claimed is:

1. A luminous body comprising a transparent plastic moulding and LED DIEs, wherein the moulding includes a plurality of indentations, with one of the LED DIEs being disposed in each of the indentations such that one side of each LED DIE lies substantially flush with an upper side of the moulding, and each LED DIE is connected to an electricity supply via two electrical conductors disposed on the moulding, wherein the two electrical conductors contacting the upper side of the moulding so as not to cover the indentations, and two poles directly connecting the one side of each of the LED DIEs to the two electrical conductors, wherein the luminous body further comprises a plastic film disposed on the plastic moulding over an open side of the indentations, wherein the plastic film is configured to permit the LED DIEs to radiate on the open side of the indentations.

2. The luminous body according to claim 1, wherein the LED DIEs are fixed in the indentations by a casting compound.

3. The luminous body according to claim 1, wherein the electrical conductors include a first conductor track disposed on an opposite side of the moulding from a second conductor track.

4. The luminous body according to claim 1, wherein the plastic film is disposed as a protective layer over the electrical conductors.

5. A luminous body comprising a transparent plastic moulding and LED DIEs, wherein the moulding includes a plurality of indentations, with one of the LED DIEs being disposed in each of the indentations such that one side of each LED DIE lies substantially flush with an upper side of the moulding, and each LED DIE is connected to an electricity supply via two electrical conductors disposed on the moulding, wherein the two electrical conductors contacting the upper side of the moulding so as not to cover the indentations, and two poles directly connecting the one side of each of the LED DIEs to the two electrical conductors, wherein the luminous body further comprises a plastic film disposed on the plastic moulding over an open side of the indentations and wherein the plastic film is configured to direct light from the LED DIEs through a bottom of the indentations.

6. The luminous body according to claim 1, wherein the LED DIEs are fixed in the indentations by a casting compound.

7. The luminous body according to claim 1, wherein the electrical conductors are disposed on a side of the moulding including an open side of the indentations.

8. The luminous body according to claim 5, wherein the electrical conductors include a first conductor track disposed on an opposite side of the moulding from a second conductor track.

9. The luminous body according to claim 5, wherein the plastic film is disposed as a protective layer over the electrical conductors.

10. The luminous body according to claim 5, wherein the plastic film includes a reflective layer.

11. The luminous body according to claim 1, further comprising a reflective layer disposed on the plastic moulding on an open side of the indentations.

* * * * *